(12) United States Patent
Lan et al.

(10) Patent No.: US 9,343,399 B2
(45) Date of Patent: May 17, 2016

(54) THICK CONDUCTIVE STACK PLATING PROCESS WITH FINE CRITICAL DIMENSION FEATURE SIZE FOR COMPACT PASSIVE ON GLASS TECHNOLOGY

(71) Applicant: QUALCOMM Incorporated, San Diego, CA (US)

(72) Inventors: Je-Hsiung Lan, San Diego, CA (US); Chengjie Zuo, Santee, CA (US); Changhan Hobie Yun, San Diego, CA (US); Jonghae Kim, San Diego, CA (US); Daeik Daniel Kim, San Diego, CA (US); Mario Francisco Velez, San Diego, CA (US); Robert Paul Mikulka, Oceanside, CA (US); Niranjan Sunil Mudakatte, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/149,530

(22) Filed: Jan. 7, 2014

(65) Prior Publication Data
US 2015/0014812 A1 Jan. 15, 2015

Related U.S. Application Data

(60) Provisional application No. 61/845,573, filed on Jul. 12, 2013.

(51) Int. Cl.
*H01L 21/02* (2006.01)
*H01L 23/498* (2006.01)
(Continued)

(52) U.S. Cl.
CPC ...... *H01L 23/49822* (2013.01); *H01L 23/5222* (2013.01); *H01L 23/5227* (2013.01); *H01L 23/642* (2013.01); *H01L 27/016* (2013.01); *H01L 28/60* (2013.01); *H01L 23/645* (2013.01); *H01L 27/0805* (2013.01); *H01L 28/10* (2013.01); *H01L 2924/0002* (2013.01)

(58) Field of Classification Search
CPC ............... H01L 23/49822; H01L 23/5222; H01L 23/642; H01L 27/016; H01L 28/60
See application file for complete search history.

(56) References Cited

U.S. PATENT DOCUMENTS 5,891,799 A * 4/1999 Tsui ................. H01L 21/31116
257/E21.252
6,020,255 A * 2/2000 Tsai ................. H01L 21/76807
257/E21.579

(Continued)

OTHER PUBLICATIONS

International Search Report and Written Opinion—PCT/US2014/038976—ISA/EPO—Nov. 17, 2014.

(Continued)

*Primary Examiner* — Nicholas Tobergte
(74) *Attorney, Agent, or Firm* — Seyfarth Shaw LLP

(57) ABSTRACT

An integrated circuit device includes a substrate, and a first interlayer dielectric layer on the substrate that includes a first conductive layer and a second conductive layer. The integrated circuit device also includes a first conductive stack including a third conductive layer coupled to a portion of the second conductive layer with a first via. The integrated circuit device further includes a second conductive stack comprising a fourth conductive layer directly on a portion of the third conductive layer that is isolated from the substrate. The integrated circuit device also includes a second interlayer dielectric layer surrounding the third conductive layer and the fourth conductive layer.

12 Claims, 19 Drawing Sheets

(51) Int. Cl.
  *H01L 23/522* (2006.01)
  *H01L 23/64* (2006.01)
  *H01L 27/01* (2006.01)
  *H01L 27/08* (2006.01)
  *H01L 49/02* (2006.01)

(56) References Cited

U.S. PATENT DOCUMENTS

| | | | |
|---|---|---|---|
| 6,025,226 A * | 2/2000 | Gambino | H01L 21/76807 257/E21.009 |
| 6,083,824 A * | 7/2000 | Tsai | H01L 21/31144 257/E21.257 |
| 7,135,951 B1 | 11/2006 | Sidhu et al. | |
| 7,501,342 B2 | 3/2009 | Wang et al. | |
| 7,582,556 B2 | 9/2009 | Lin et al. | |
| 7,964,965 B2 | 6/2011 | Lee | |
| 2002/0006700 A1* | 1/2002 | Kanamori | H01L 28/60 438/253 |
| 2003/0027386 A1* | 2/2003 | Lee | H01L 21/76802 438/253 |
| 2003/0156378 A1* | 8/2003 | Chiang | H01L 21/76808 361/313 |
| 2003/0178666 A1* | 9/2003 | Lee | H01L 21/76802 257/306 |
| 2005/0142857 A1 | 6/2005 | Lee | |
| 2007/0267705 A1 | 11/2007 | Won et al. | |
| 2009/0322447 A1* | 12/2009 | Daley | H01L 23/5223 333/185 |
| 2013/0161817 A1 | 6/2013 | Khandekar et al. | |

OTHER PUBLICATIONS

Armacost M., et al., "A high reliability metal insulator metal capacitor for 0.18/spl mu/m copper technology", Electron Devices Meeting, 2000. IEDM Technical Digest. International Dec. 10-13, 2000, Piscataway, NJ, USA,IEEE, Dec. 10, 2000, pp. 157-160, XP032403062, DOI: 10.1109/IEDM.2000.904282 ISBN: 978-0-7803-6438-7.

Partial International Search Report—PCT/US2014/038976—ISA/EPO—Sep. 29, 2014.

* cited by examiner

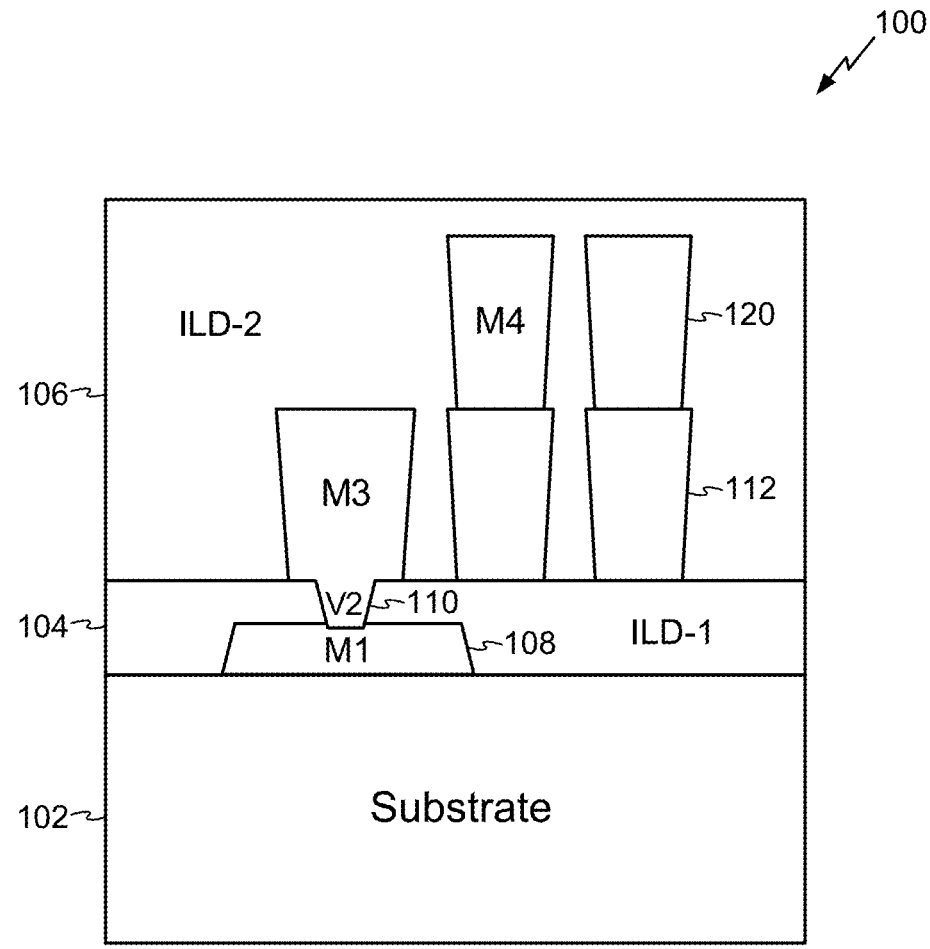
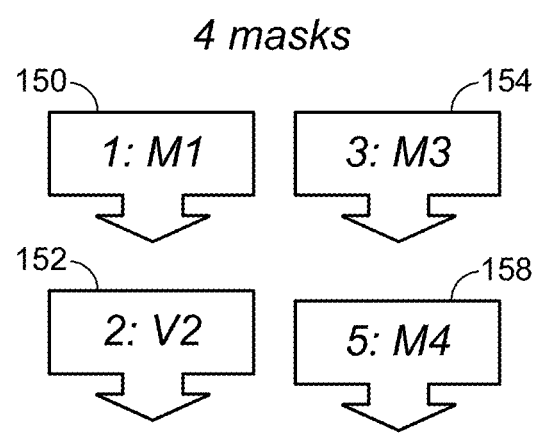
FIG. 1

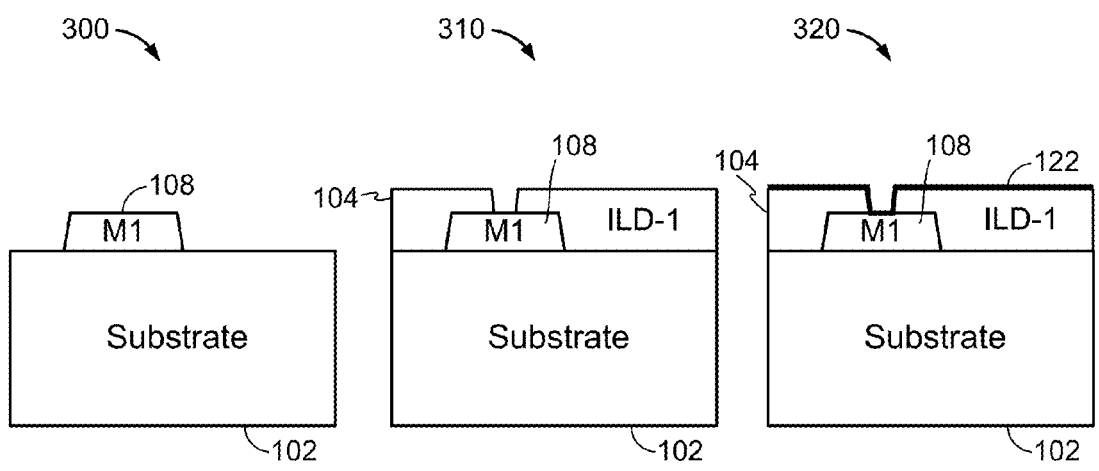
*FIG. 3A*  *FIG. 3B*  *FIG. 3C*

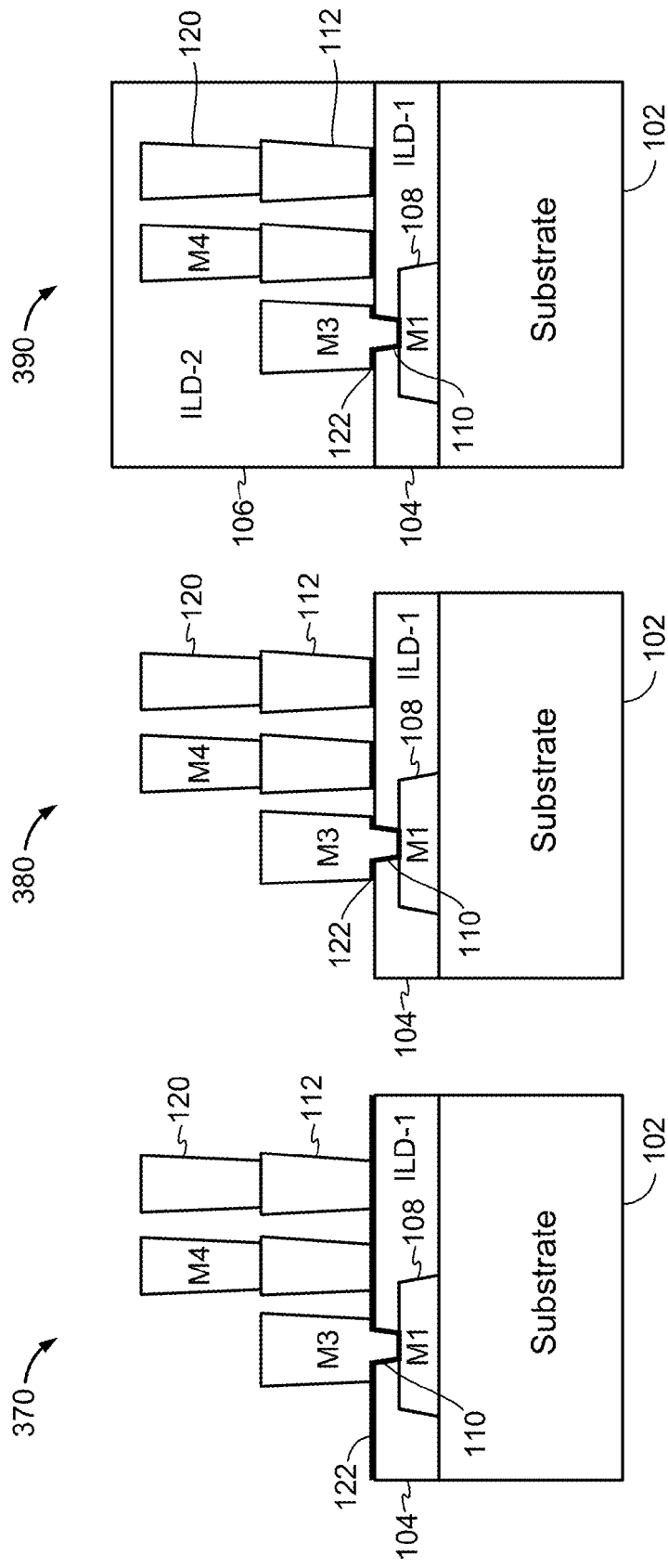

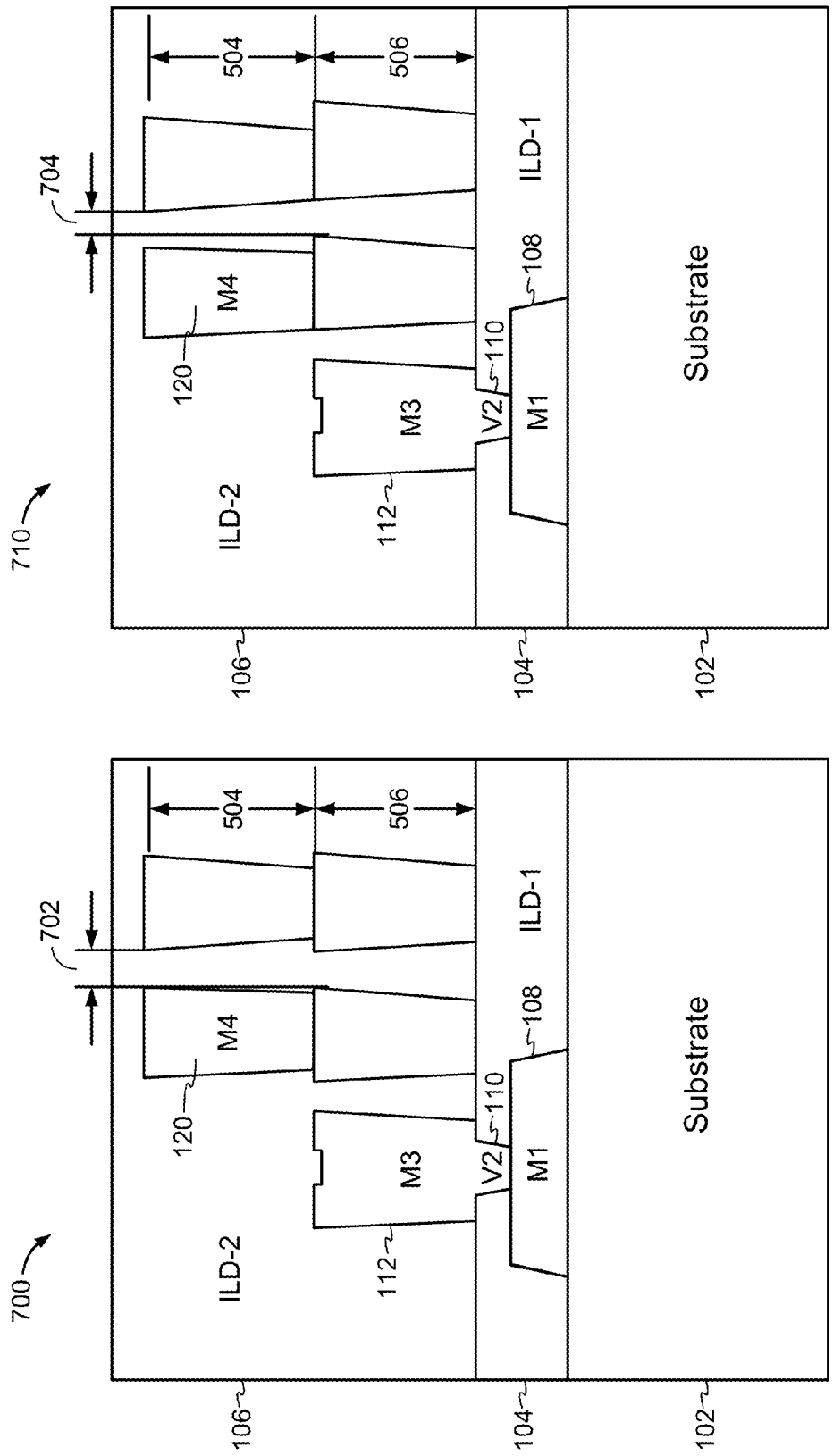

THICK CONDUCTIVE STACK PLATING PROCESS WITH FINE CRITICAL DIMENSION FEATURE SIZE FOR COMPACT PASSIVE ON GLASS TECHNOLOGY

CROSS REFERENCE TO RELATED APPLICATION

The present application claims the benefit of U.S. Provisional Patent Application No. 61/845,573 filed on Jul. 12, 2013, in the names of Je-Hsiung Lan et al., the disclosure of which is expressly incorporated by reference herein in its entirety.

TECHNICAL FIELD

The present disclosure generally relates to integrated circuits (ICs). More specifically, the present disclosure relates to a thick conductive stack plating process with fine critical dimension feature size for compact passive on glass technology.

BACKGROUND

The process flow for semiconductor fabrication of integrated circuits (ICs) may include front-end-of-line (FEOL), mid-end-of-line (MEOL), and back-end-of-line (BEOL) processes. The FEOL process may include wafer preparation, isolation, well formation, gate patterning, spacer, extension and source/drain implantation, silicide formation, and dual stress liner formation. The MEOL process may include gate contact formation. The BEOL processes may include a series of wafer processing steps for interconnecting the semiconductor devices created during the FEOL and MEOL processes. Successful fabrication and qualification of modern semiconductor chip products involves an interplay between the materials and the processes employed. In particular, the formation of conductive material plating for the semiconductor fabrication in the BEOL processes is an increasingly challenging part of the process flow. This is particularly true in terms of maintaining a small feature size. The same challenge of maintaining a small feature size also applies to passive on glass (POG) technology, where high-performance components such as inductors and capacitors are built upon a highly insulative substrate that may also have a very low loss.

Passive on glass devices involve high-performance inductor and capacitor components that have a variety of advantages over other technologies, such as surface mount technology or multi-layer ceramic chips. These advantages include being more compact in size and having smaller manufacturing variations. Passive on glass devices also involve a higher Q (or quality factor) value that meets stringent low insertion loss and low power consumption specifications.

SUMMARY

In one aspect of the present disclosure, an integrated circuit device is disclosed. The device includes a substrate. The device also includes a first interlayer dielectric layer on the substrate that includes a first conductive layer and a second conductive layer. The device further includes a first conductive stack that includes a third conductive layer coupled to a portion of the second conductive layer with a first via. The device also includes a second conductive stack that includes a fourth conductive layer directly on a portion of the third conductive layer that is isolated from the substrate. The device further includes a second interlayer dielectric layer surrounding the third conductive layer and the fourth conductive layer.

Another aspect discloses an integrated circuit device that includes a substrate. The device also includes a first interlayer dielectric layer on the substrate that includes a first conductive means and a second conductive means. The device further includes a first conductive stack that includes a third conductive means coupled to a portion of the second conductive means with a first via. The device also includes a second conductive stack that includes a fourth conductive means directly on a portion of the third conductive means that is isolated from the substrate. The device further includes a second interlayer dielectric layer surrounding the third conductive means and the fourth conductive means.

In another aspect, a back end of line processing method to fabricate a device is disclosed. The method includes depositing a first photoresist layer on a first interlayer dielectric layer and a substrate. The method also includes depositing a first conductive layer between gaps in the first photoresist layer. The method further includes depositing a second photoresist layer on the first photoresist layer. The method also includes depositing a second conductive layer directly on the first conductive layer between gaps in the second photoresist layer. The method further includes stripping the second photoresist layer and then the first photoresist layer to expose the first interlayer dielectric layer. The method also includes depositing a second interlayer dielectric layer on the first interlayer dielectric layer and also around the first and the second conductive layers.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 1 shows a cross-sectional view illustrating a device fabricated from a conductive stack plating process according to one aspect of the disclosure.

FIGS. 3A-3J show cross-sectional views illustrating steps of a conductive stack plating process according to one aspect of the disclosure.

FIGS. 7A-7B show cross-sectional views comparing the spacing of two devices fabricated from a conductive stack plating process according to aspects of the disclosure.

DETAILED DESCRIPTION

Figure 2:
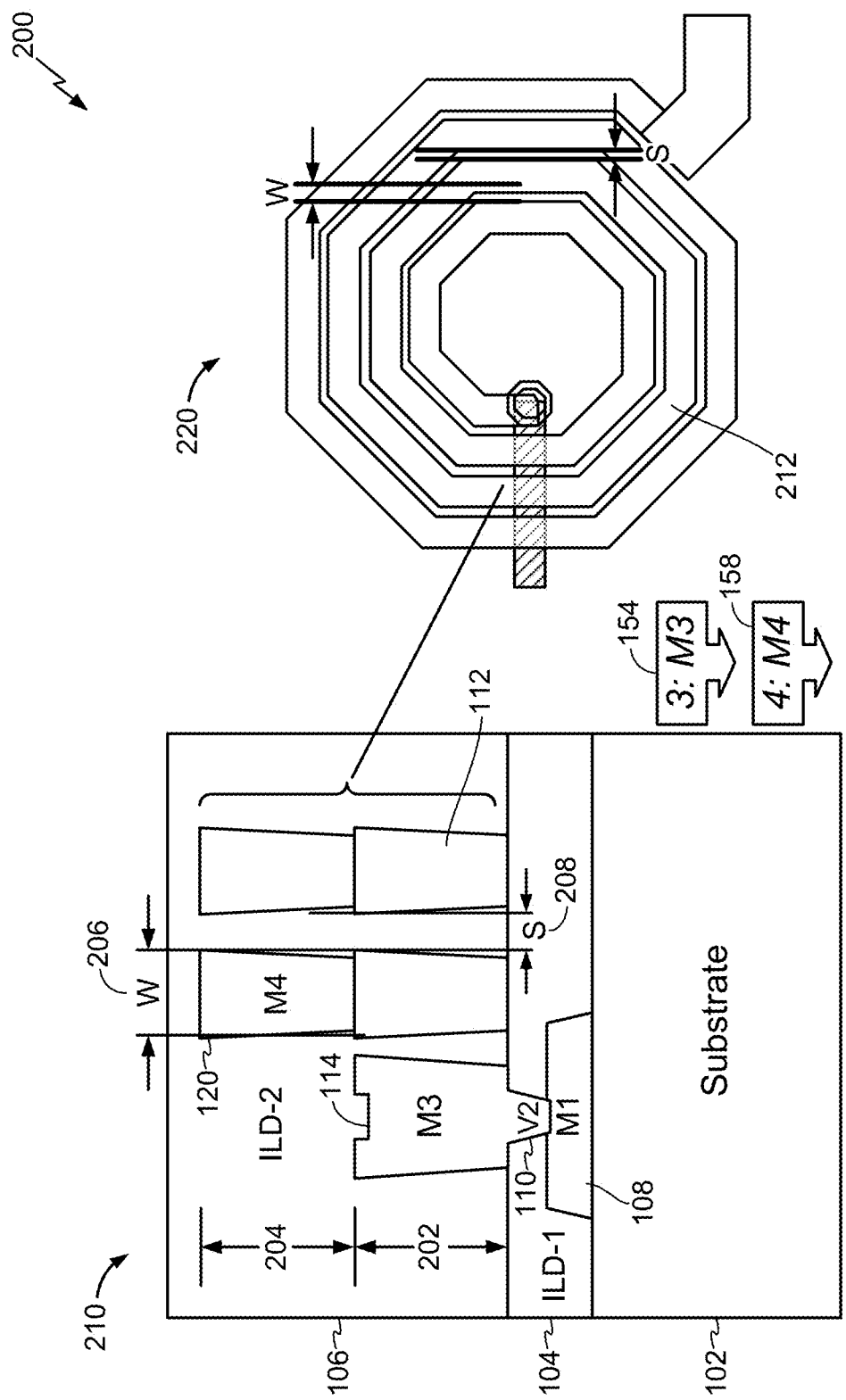
FIG. 2 shows a cross-sectional view and a layout view of an inductor fabricated with a conductive stack plating process according to one aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Thick trace layers of a highly conductive material (e.g., copper) may achieve high-performance inductors or capacitors with compact device sizes on a passive on glass device. Current conductive material plating process techniques for thicker conductive material trace layers may involve larger line width and spacing dimensions. This, however, goes against maintaining a compact device size. Although techniques exist for increasing the thickness of these conductive material trace layers, such techniques end up increasing the device size or adding fabrication steps. Techniques for attaining thicker conductive material trace layers to enhance device performance while reducing device size and maintaining an efficient fabrication are described.

Various aspects of the disclosure provide techniques for a thick conductive stack plating process with a fine critical dimension feature size for high performance and compact passive on glass technologies. In accordance with an aspect of the disclosure, a conductive stack plating process increases the conductive material plating thickness for high-Q components used for passive on glass technology, such as spiral inductors. The thickness can be increased without increasing the line width and spacing of the critical design features, which subsequently keeps the component at a small size for compact product circuit design.

One disclosed conductive stack plating process may involve sequential stacking, with the patterning of a second photoresist layer occurring after the plating of the first conductive material layer, using the same patterning mask. This patterning mask may also have slightly smaller feature sizes. Using the same patterning mask also eliminates the interlayer dielectric formation step, which may also include the time-consuming processes of spin-coating, photolithography and thermal-curing. An additional benefit of removing the interlayer dielectric formation step is preventing the interlayer dielectric layer from restricting the feature size of the thick conductive material trace layer. Therefore, the disclosed conductive stack plating process reduces the number of process steps overall, which thereby reduces the manufacturing cost as well as the cycle time of the fabrication process.

FIG. 1 shows a cross-sectional view illustrating a device 100 fabricated from a conductive stack plating process according to one aspect of the present disclosure. The device 100 includes a substrate 102, which may be made of glass or other materials such as Silicon (Si), Gallium Arsenide (GaAs), Indium Phosphide (InP) Silicon Carbide (SiC), Sapphire ($Al_2O_3$), Quartz, Silicon on Insulator (SOI), Silicon on Sapphire (SOS), High Resistivity Silicon (HRS), Aluminum Nitride (AlN), a plastic substrate, a laminate, or a combination thereof. As described herein, the term "semiconductor substrate" may refer to a substrate of a diced wafer or may refer to the substrate of a wafer that is not diced. Similarly, the terms wafer and die may be used interchangeably unless such interchanging would tax credulity.

As shown in FIG. 1, a first interlayer dielectric layer 104 is on the substrate 102. Within the first interlayer dielectric layer 104 can be seen a first conductive layer contact 108 and a first via 110. A second interlayer dielectric layer 106 is on the first interlayer dielectric layer 104. Within the second interlayer dielectric layer 106 can be seen a third conductive layer 112 and a fourth conductive layer 120. The device 100 may be fabricated by a series of three photolithography masks that are applied sequentially. Initially, the first conductive layer mask 150 is applied to etch the deposited first conductive material layer to form the first conductive layer contact 108. Second, the first via mask 152 is applied to etch a pattern into the first interlayer dielectric layer 104 to form the first via 110. Alternatively, the first via 110 can be formed by using a photodefinable polyimide (PI) which can be formed into the first via 110 during a photo development process (i.e., no dry or wet etch process is used to pattern the first via 110 into the first interlayer dielectric layer 104). Third, the third conductive material layer mask 154 is applied to etch the deposited third conductive material layer to form the third conductive layer 112. And fourth, the fourth conductive material layer mask 158 is applied to etch the deposited fourth conductive material layer to form the fourth conductive layer 120.

Unlike typical devices, the device 100 does not have a second via within the third conductive layer 112. Therefore, the fourth conductive layer 120 is directly coupled to the third conductive layer 112, with no via in between. In one implementation, the fourth conductive layer 120 may be directly deposited and etched on top of the third conductive layer 112. By removing the second via, the conductive stack plating process used to form the device 100 removes process steps and is much more efficient than typical conductive stack plating processes. Also, by removing the second via, the device 100 is smaller and has a more compact size compared to devices formed by typical conductive stack plating processes. As will be described later, the width and spacing dimensions of the device 100 are also much smaller than, and almost half the size of the width and spacing dimensions of devices fabricated by typical conductive stack plating processes.

Another difference between the device 100 and typical devices is that there is no third interlayer dielectric layer. Also, both the third conductive layer 112 and the fourth conductive layer 120 are compactly stored within the second interlayer dielectric layer 106, instead of the fourth conductive layer 120 being within a third interlayer dielectric layer, for example. Therefore, this saves space by resulting in a more compact device size. This also saves time in eliminating the processing steps to deposit and etch a third interlayer dielectric layer, which may include the time-consuming steps of coating, photolithography and curing. Therefore, the conductive stack plating process to fabricate the device 100 is much more efficient than typical processes, and it also produces a more compact device design.

The fabrication of the device 100 uses just four masks, as compared to the potentially five masks that may be used to fabricate typical devices. For instance, a second via mask to fabricate a second via is not necessary. Also, a mask to etch a third interlayer dielectric layer is also not necessary. Not having to fabricate the third interlayer dielectric layer and/or the second via also saves time by eliminating time-consuming steps such as deposition and photolithography. A typical integrated passives on glass (POG) process may involve at least spin-coating, pre-baking, photolithography, and thermal-curing. Eliminating the third interlayer dielectric layer and the second via saves space by resulting in a smaller overall device design. Eliminating the second via also makes the device easier to align, because fewer layers are involved. Therefore, the conductive stack plating process of the present disclosure reduces the device size, saves manufacturing costs and is more efficient than typical processes.

In one implementation, the conductive material for the various conductive material layers and vias such as the first conductive layer contact 108, the first via 110, the third conductive layer 112 and the fourth conductive layer 120 may be Copper (Cu), or other conductive materials with high conductivity such as Silver (Ag), Copper (Cu), Gold (Au), Aluminum (Al), Tungsten (W), Nickel (Ni), and other like materials.

FIG. 2 shows a cross-sectional view 210 and a layout view 220 of an inductor 200 fabricated with a conductive stack plating process according to one aspect of the disclosure. The inductor 200 shown may be a spiral inductor that also has a high Q or quality factor suited for high performance applications. In this configuration, the inductor 200 may be a high-Q planar spiral inductor that may also incorporate the thick stacking of conductive material layers for a main cord 212 to reduce the series resistance of the entire trace. For example, the thickness height of a conductive material stack may be increased. The conductive material stack includes both the third conductive layer 112 and the fourth conductive layer 120. The thickness height of this conductive material stack combines two thickness values: a third conductive material layer pattern thickness 202 and a fourth conductive material layer pattern thickness 204. In one implementation, the third conductive material layer pattern thickness 202 may be around 15 μm and the fourth conductive material layer pattern thickness 204 may also be around 15 μm, resulting in a combined total stack thickness of 30 μm. This increased thickness reduces the series resistance, lowers insertion loss and decreases power consumption, which taken together improves the overall performance of the inductor 200. The width and spacing dimensions, represented by a conductive material layer pattern width 206 and an inter-conductive material layer pattern spacing 208, are also reduced in order to decrease the size of the inductor 200.

The cross-sectional view 210 of the inductor 200 is also similar to the device 100 of FIG. 1, because the inductor 200 is a device fabricated by the conductive stack plating process of the present disclosure. As will be described later, the thickness values (e.g., the third conductive material layer pattern thickness 202 and the fourth conductive material layer pattern thickness 204) will be increased to improve the performance of the device, while the width and spacing dimensions (e.g., the conductive material layer pattern width 206 and the inter-conductive material layer pattern spacing 208) will be decreased to reduce the overall device size.

FIGS. 3A-3J show cross-sectional views illustrating a conductive stack plating process according to one aspect of the disclosure.

In FIG. 3A, a device 300 has the first conductive layer contact 108 on the substrate 102. The substrate 102 may be made of glass or other materials such as Silicon (Si), Gallium Arsenide (GaAs), Indium Phosphide (InP), Silicon Carbide (SiC), Sapphire ($Al_2O_3$), Quartz, Silicon on Insulator (SOI), Silicon on Sapphire (SOS), High Resistivity Silicon (HRS), Aluminum Nitride (AlN), a plastic substrate, a laminate, or a combination thereof. The first conductive layer contact 108 may be formed by depositing onto the substrate 102 a first conductive material layer (not shown) and then etching the first conductive material layer with the first conductive layer mask 150. The first conductive material layer may be deposited by electroplating, chemical vapor deposition (CVD), and/or physical vapor deposition (PVD), such as sputtering or evaporation. In one implementation, the first conductive layer mask 150 may pattern the first conductive layer contact 108.

In FIG. 3B, a device 310 has the first interlayer dielectric layer 104 deposited onto both the substrate 102 and the first conductive layer contact 108. The first interlayer dielectric layer 104 may be deposited by a spin-coating process, chemical vapor deposition (CVD), physical vapor deposition (PVD), sputtering, and/or evaporation. The first interlayer dielectric layer 104 may be made of PVD or CVD oxide, such as Silicon Dioxide ($SiO_2$). To reduce the parasitic capacitance of a high Q inductor, materials having a low k, or a low dielectric constant value, are preferred for the first interlayer dielectric layer 104, such as doped Silicon Dioxide ($SiO_2$), or its Fluorine-doped, Carbon-doped, porous and porous Carbon-doped forms, as well as spin-on organic polymeric dielectrics such as polyimide (PI), polynorbornenes, benzocyclobutene (BCB), polytetrafluoroethylene (PTFE) and spin-on silicone based polymeric dielectrics. A pattern is also etched into the first interlayer dielectric layer 104 to form the first via 110. The pattern may be etched and then exposed by any photolithography and/or chemical etching process. In one implementation, the first via mask 152 may be used to form the pattern in the first interlayer dielectric layer 104.

In FIG. 3C, a device 320 has a seed layer 122 deposited on the first interlayer dielectric layer 104. The seed layer 122 may be Titanium Copper (TiCu), or other compounds made of copper that are suitable to serve as a seed layer for copper plating. The seed layer 122 may be deposited by atomic layer deposition (ALD), chemical vapor deposition (CVD), physical vapor deposition (PVD), sputtering, and/or evaporation.

Figures 3D, 3E:
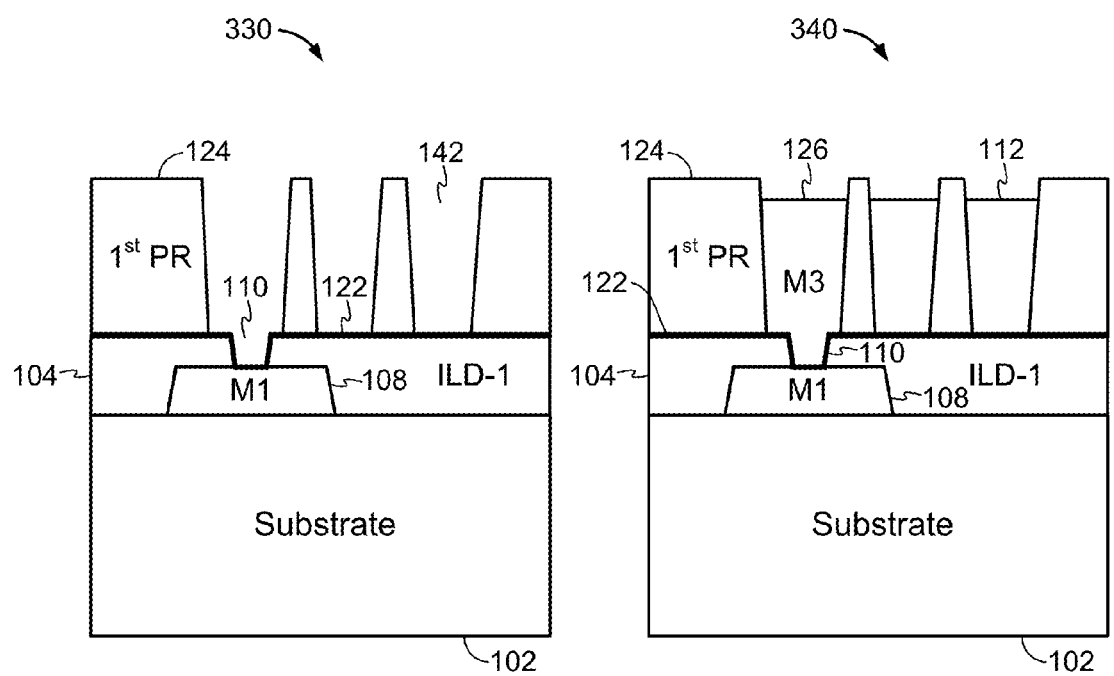

In FIG. 3D, a device 330 includes a first photoresist layer 124 deposited on the seed layer 122, and then exposed and etched to form at least one first valley-like pattern 142. The first photoresist layer 124 may be deposited by spin-coating, droplet-based photoresist deposition, and/or spraying. The first photoresist layer 124 may be exposed and then etched by chemical etching processes using solutions such as photoresist developer, which may be made of, for example, Tetramethylammonium Hydroxide (TMAH), Iron Chloride ($FeCl_3$), Cupric Chloride (CuCl$_2$) or Alkaline Ammonia (NH$_3$), in order to wash away the exposed photoresist portions. Dry etching processes using plasmas may also be used to etch the first photoresist layer 124. In one implementation, the third conductive material layer mask 154 (FIG. 1) may form the at least one first valley-like pattern 142 in the first photoresist layer 124. The first via 110 is also shown as a space in which the third conductive material 126 is deposited (to be discussed in FIG. 3E).

In FIG. 3E, a device 340 includes the third conductive material 126 deposited into the at least one first valley-like pattern 142 of the first photoresist layer 124 to form the third conductive layer 112 as well as the first via 110. The third conductive material 126 may be deposited by electroplating, chemical vapor deposition (CVD), physical vapor deposition (PVD), sputtering, or evaporation.

Figures 3F, 3G:
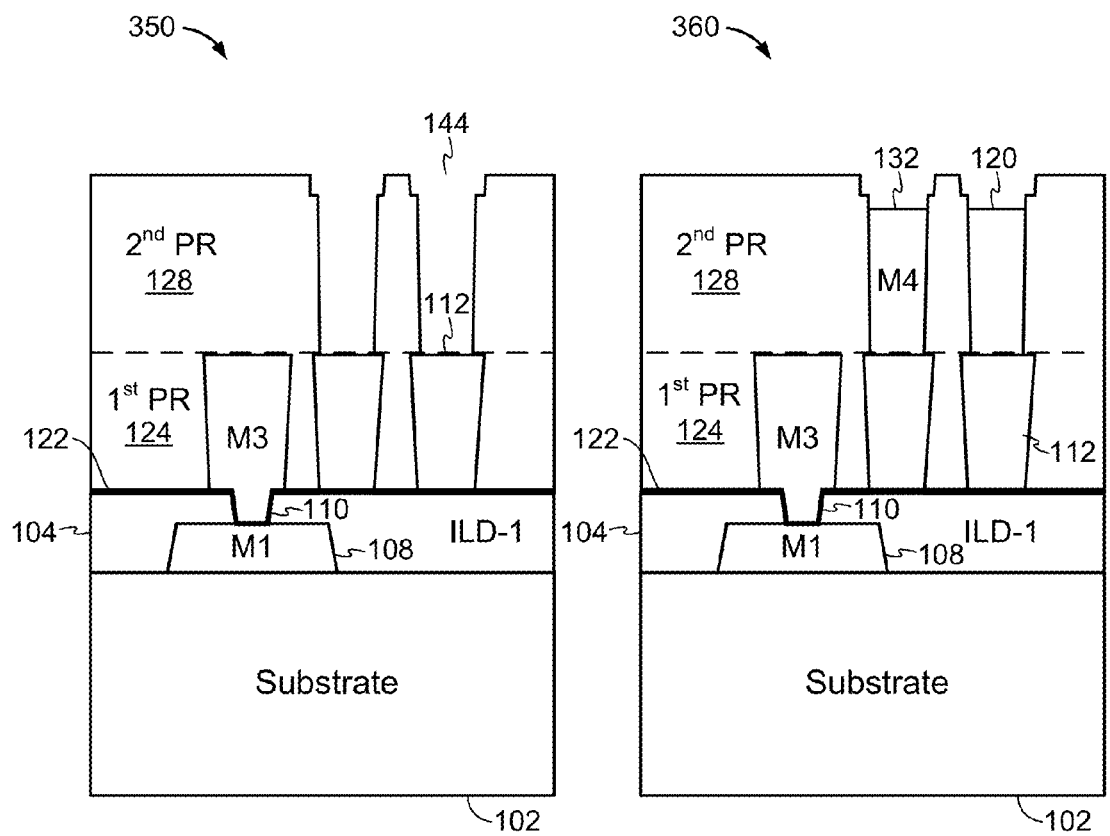

In FIG. 3F, a device 350 shows a second photoresist layer 128 deposited on the first photoresist layer 124 and also on the third conductive layer 112. The second photoresist layer 128 is then exposed and etched to form at least one second valley-like pattern 144. The second photoresist layer 128 may be exposed and then etched by chemical etching processes using solutions such as a photoresist developer, which may be made of, for example, Tetramethylammonium Hydroxide (TMAH), Iron Chloride (FeCl$_3$), Cupric Chloride (CuCl$_2$) or Alkaline Ammonia (NH$_3$), in order to wash away the exposed photoresist portions. Dry etching processes using plasmas may also etch the second photoresist layer 128. In one implementation, the fourth conductive material layer mask 158 (FIG. 1) may form the at least one second valley-like pattern 144 in the second photoresist layer 128.

In FIG. 3G, a device 360 has the fourth conductive material 132 deposited into the at least one second valley-like pattern 144 in the second photoresist layer 128 to form the fourth conductive layer 120. The fourth conductive material 132 may be deposited by electroplating, chemical vapor deposition (CVD), physical vapor deposition (PVD), sputtering, or evaporation.

In FIG. 3H, a device 370 has all the photoresist layers (e.g., the first photoresist layer 124 and the second photoresist layer 128) stripped, which results in the third conductive layer 112, the fourth conductive layer 120 and the rest of the device being left intact. The photoresist layers may be stripped by a chemical photoresist stripping process using a photoresist stripper such as, for example, Positive Resist Stripper (PRS-2000), N-Methyl-2-Pyrrolidone (NMP), or Acetone. Photoresist layers may also be stripped by a dry photoresist stripping process using plasmas such as oxygen, which is known as ashing.

In FIG. 3I, a device 380 has the seed layer 122 etched away, leaving only the seed layer portions covered by the third conductive layer 112. The seed layer 122 may be etched and exposed by photolithography and any chemical etching process or dry etching process, for example using plasmas.

In FIG. 3J, a device 390 has a second interlayer dielectric layer 106 deposited on the first interlayer dielectric layer 104 and also covering and surrounding the third conductive layer 112 and the fourth conductive layer 120. The second interlayer dielectric layer 106 may be deposited by a spin-coating process, chemical vapor deposition (CVD), physical vapor deposition (PVD), sputtering, or evaporation.

The process shown in FIGS. 3A-3J saves significant time by eliminating the step of forming a third interlayer dielectric layer, which may also contain the time-consuming steps of coating, photolithography and curing. Removing the third interlayer dielectric layer also reduces the overall size of the device, conserves resources and reduces manufacturing costs. A second via mask to form a second via is also eliminated because the second via is not fabricated. Typically, the second via may be coupled to both the third conductive layer 112 in the second interlayer dielectric layer 106 and the fourth conductive layer 120 in the third interlayer dielectric layer. By removing the fabrication step to form the second via, the third interlayer dielectric layer is removed altogether. Therefore, this conductive stack plating process may save both time and space by eliminating process steps and photolithography masks.

Figure 4:
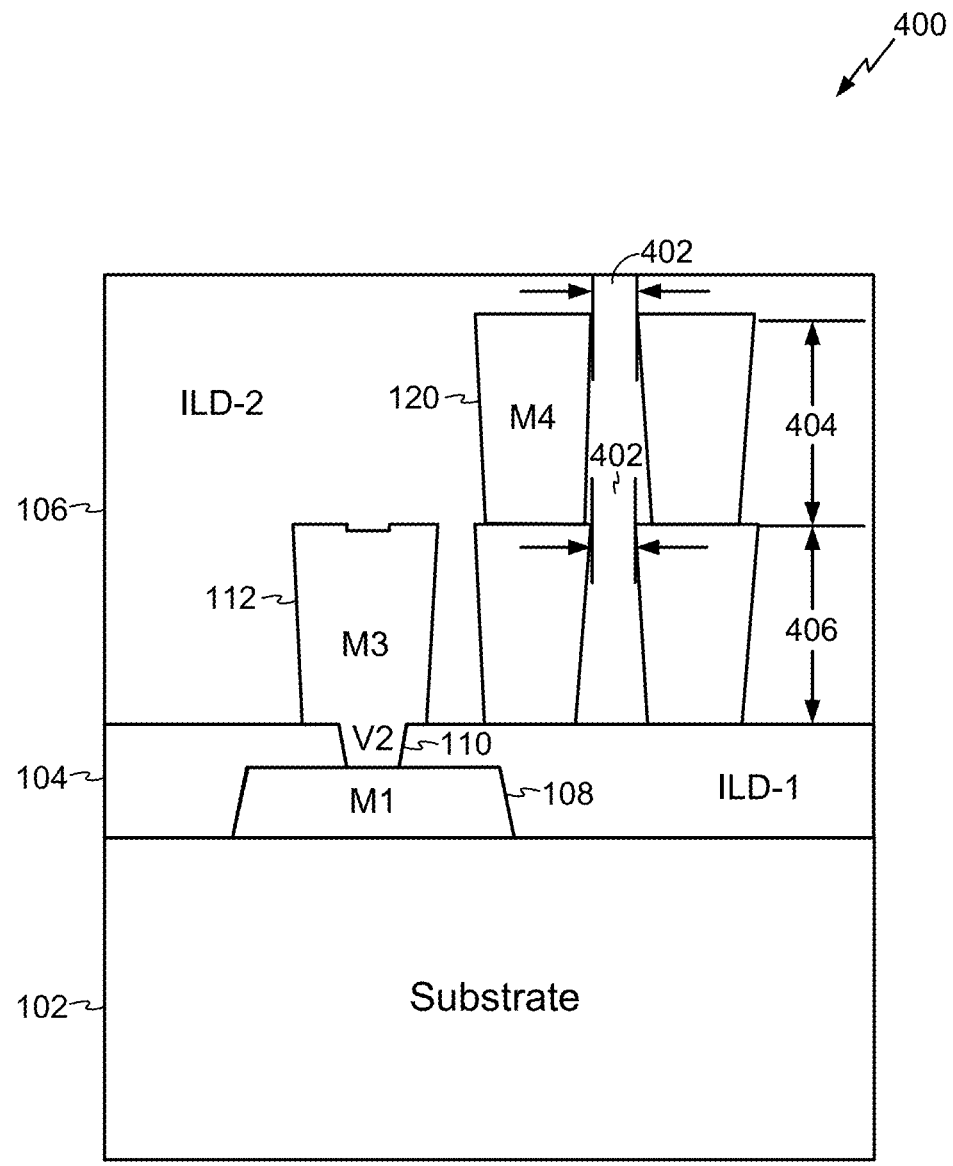
FIG. 4 shows a cross-sectional view of a device fabricated from a conductive stack plating process according to one aspect of the disclosure.

FIG. 4 shows a cross-sectional view of a device 400 fabricated from a conductive stack plating process according to one aspect of the disclosure. The device 400 may have a spacing width 402 that is smaller than or less than half the size of a device spacing width of a device fabricated from a typical conductive stack plating process. In one implementation, the spacing width 402 is around 15 µm or smaller. Therefore, the device 400 has smaller critical feature dimensions when compared to devices fabricated from typical conductive stack plating processes.

The device 400 may also have a high combined height of a first conductive material stack height 404 and a second conductive material stack height 406. Increasing the thickness height of the conductive material stack improves the overall performance of the device. Therefore, having two thickness height dimensions to increase in the device 400 yields a better performance than having just one thickness height dimension to increase in a device fabricated from a typical conductive stack plating process.

Figure 5:
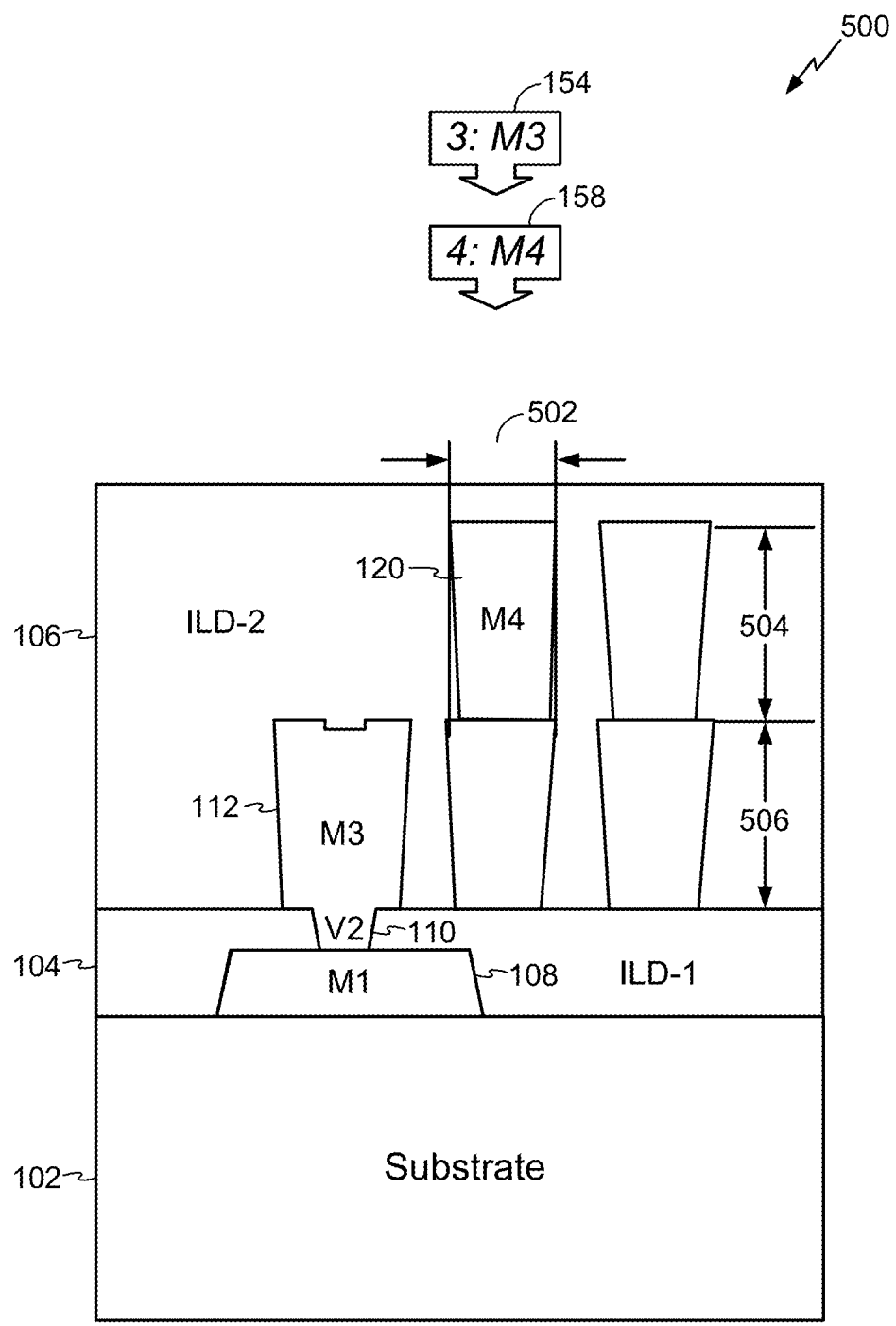
FIG. 5 shows a cross-sectional view of a device fabricated from a conductive stack plating process according to one aspect of the disclosure.

FIG. 5 shows a cross-sectional view of a device 500 fabricated from a conductive stack plating process according to one aspect of the disclosure. The device 500 has a pattern width 502 that may be reduced. In one implementation, the pattern width 502 is around 15 µm or smaller. Also, the device 500 does not have a second via so there is no via width to be concerned about. Therefore, the critical feature dimensions of the device 500 are smaller than that of typical devices fabricated from typical conductive stack plating processes. In one implementation, typical devices may have pattern widths around 30-35 µm or greater, in addition to via widths from a second via that may be around 20 µm or greater, and enclosure widths of the via-conductive material enclosure that may be around 7.5 µm or greater. To make things worse for typical devices, there are no minimum via rules or minimum via-conductive material enclosure rules that can restrain the minimum feature sizes of the widths. For typical devices, widths also become wider when there are multiple conductive material layers that stack up along with additional layers of vias.

A first conductive material stack height 504 and a second conductive material stack height 506 may have a combined height greater than the height of typical devices. Therefore, the device 500 performs better than typical devices due to this increased thickness.

The device 500 also uses just two masks: the third conductive material layer mask 154 and the fourth conductive material layer mask 158. Therefore, the process for fabricating the device 500 uses fewer masks and is faster. The process to fabricate the device 500 also results in smaller critical dimension feature sizes when compared to the process to fabricate typical devices.

Figure 6:
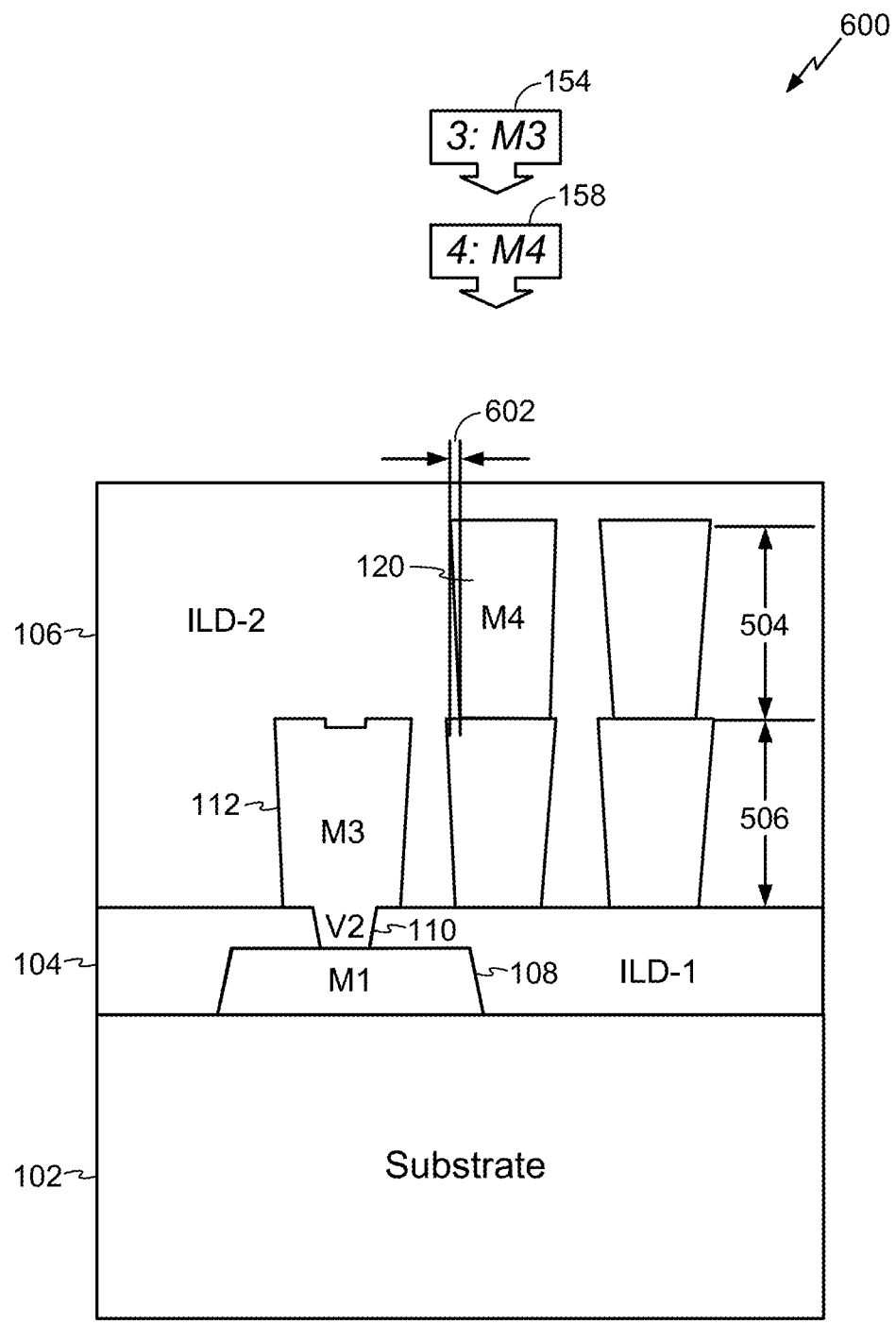
FIG. 6 shows a cross-sectional view of a device fabricated from a conductive stack plating process according to one aspect of the disclosure.

FIG. 6 shows a cross-sectional view of a device 600 fabricated from a conductive stack plating process according to one aspect of the disclosure. The device 600 has a misalignment width 602 that is reduced. The misalignment width 602 is much smaller than the misalignment widths of typical devices fabricated from typical conductive stack plating processes. Typical device misalignment widths are larger because a second via may also have to be aligned. Therefore, three layers are aligned in typical devices: the third conductive layer 112, the second via and the fourth conductive layer 120, which is also a two-step alignment process. In contrast, the device 600 aligns two layers (the third conductive layer 112 and the fourth conductive layer 120), which is a single-step alignment process. As a result, the device 600 has improved alignment when compared with conventional devices.

FIGS. 7A-7B show cross-sectional views comparing the spacing of two devices (e.g., the first device 700 and the second device 710) fabricated from a conductive stack plating process according to one aspect of the disclosure. The first device 700 has a first device inter-conductive material layer pattern spacing 702 that is wider when compared to the second device inter-conductive material layer pattern spacing 704 of the second device 710. Because of the conductive stack plating process of the present disclosure, the second device inter-conductive material layer pattern spacing 704 is variable and can be made smaller, thereby reducing the overall device size. In one implementation, the first device inter-conductive material layer pattern spacing 702 is around 15 µm or greater. In one implementation, the second device inter-conductive material layer pattern spacing 704 is around 15 µm or less.

Figures 8A, 8B, 8C:
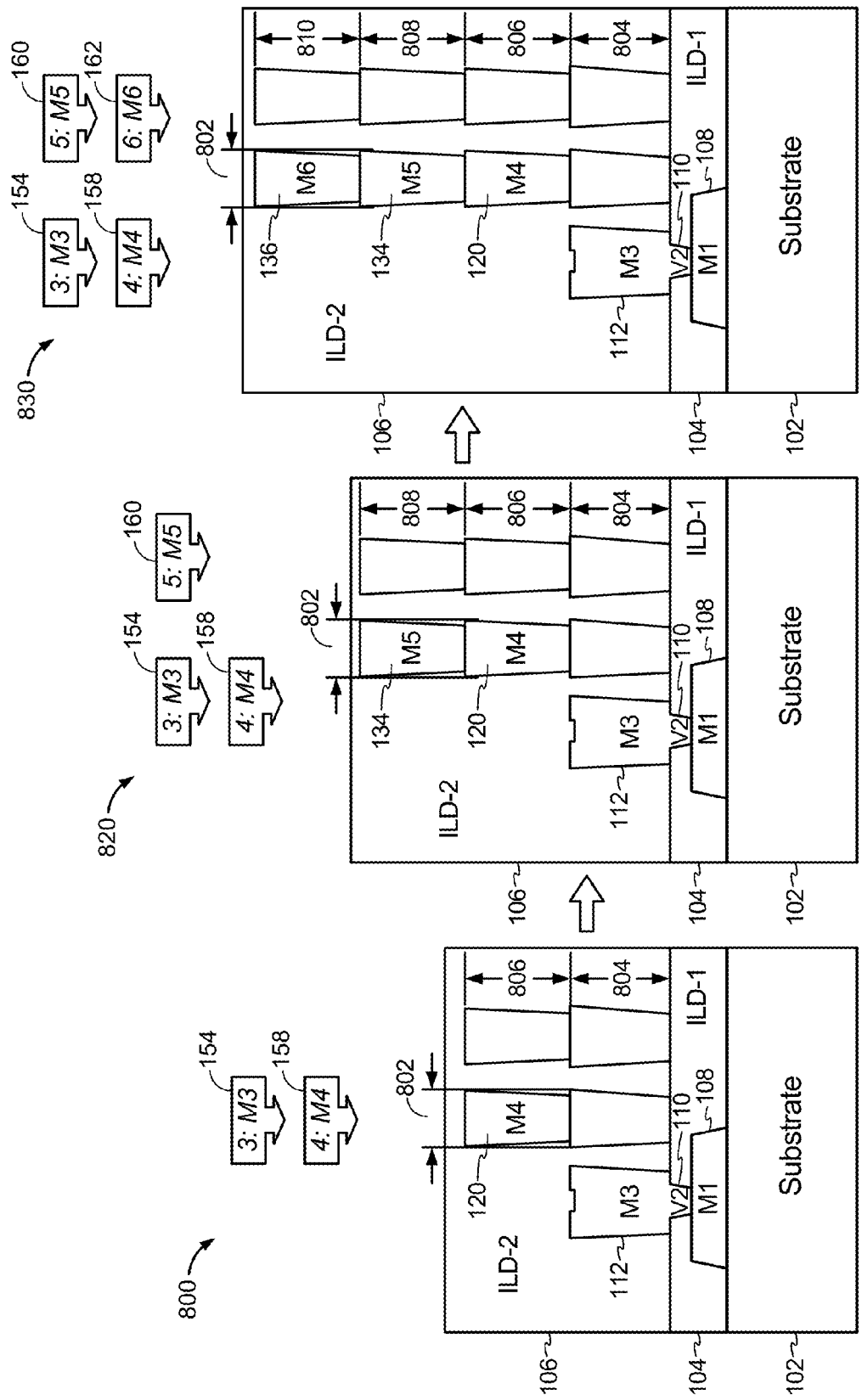
FIGS. 8A-8C show cross-sectional views illustrating the stacking of further conductive material layers in a conductive stack plating process according to aspects of the disclosure.

FIGS. 8A-8C show cross-sectional views illustrating the stacking of further conductive material layers in a conductive stack plating process according to one aspect of the disclosure. A first device 800 shows the third conductive layer 112 having a third conductive layer thickness height 804 and a fourth conductive layer 120 having a fourth conductive material layer thickness height 806, with the fourth conductive layer 120 being the highest conductive material layer. A second device 820 shows the fifth conductive material layer pattern 134 having a fifth conductive material layer height 808 as being the highest conductive material layer. The fifth conductive material layer pattern 134 may also be fabricated with a fifth conductive material layer mask 160. A third device 830 shows the sixth conductive material layer pattern 136 having a sixth conductive material layer height 810 as being the highest conductive material layer. The sixth conductive material layer pattern 136 may also be fabricated with a sixth conductive material layer mask 162. Increasing the total height of the entire conductive material stack improves the overall performance of the device, as discussed above.

For the case of an inductor, a taller conductive material stack leads to reduced series resistance, lower insertion loss and decreased power consumption. Therefore, a tall conductive material stack achieves high performance. As a result, the conductive stack plating process of the present disclosure allows the continual stacking of conductive material layer patterns and the increasing of the height values 804, 806, 808, 810 to improve the overall performance of the device. Furthermore, the number of masks specified matches the number of conductive material layers. As a result, masks—such as the masks used to fabricate vias—are eliminated, thereby making the fabrication process much more efficient. The conductive material width 802 is also kept low and around the same value when additional layers of conductive material patterns are added to the stack. In one implementation, the conductive material width 802 may be around 15 µm or smaller.

Figure 9A:
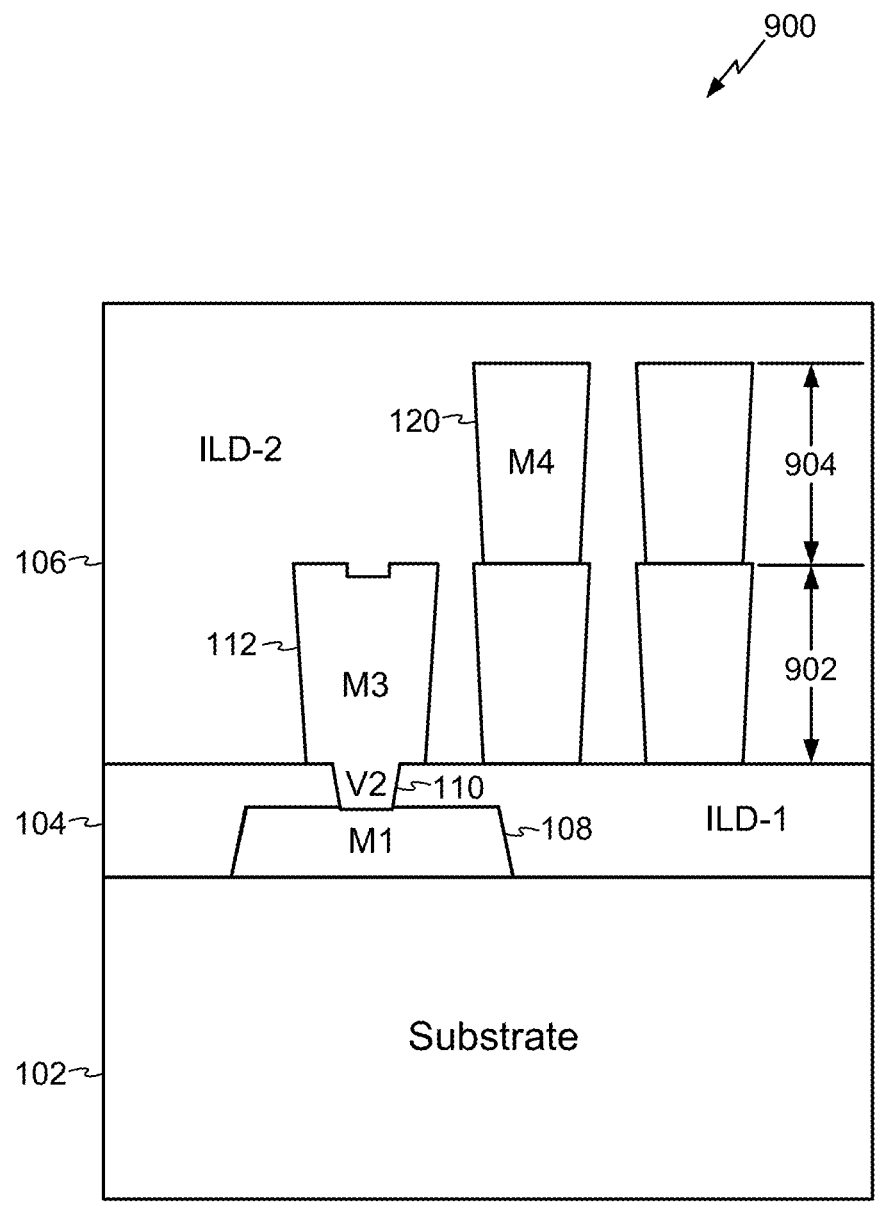
FIGS. 9A-9E show cross-sectional views illustrating devices fabricated from a conductive stack plating process according to aspects of the disclosure.

FIG. 9A shows a cross-sectional view illustrating a device fabricated from a conductive stack plating process according to one aspect of the disclosure. The device 900 is similar to the device 100 in FIG. 1, but a first conductive material stack height 902 and a second conductive material stack height 904 are shown. The device 900 eliminates elements that a typical device fabricated from a typical conductive stack plating process would fabricate, such as a second via and a third interlayer dielectric layer. Therefore, the device 900 saves space by reducing critical dimension feature sizes and removing layers. The process to fabricate the device 900 also saves time by eliminating process steps and photolithography masks. This also leads to better alignment because only two layers are aligned: the third conductive layer 112 and the fourth conductive layer 120. Furthermore, the thickness of the conductive material stack (which includes the third conductive layer 112 and the fourth conductive layer 120) can be increased by increasing the heights 902 and 904, resulting in improved overall performance of the device. Additional conductive material layer patterns may be added to the conductive material stack in order to further improve performance of the device, as shown in FIGS. 8A-8C.

In FIG. 9A, a first conductive stack includes the third conductive layer 112 directly on a portion of the first via 110 that is coupled to the first conductive layer contact 108. There is a second conductive stack that includes the fourth conductive layer 120 directly on a portion of the third conductive layer 112 that is isolated from the substrate 102. The third conductive layer 112 of the two rightmost stacks is also isolated from the substrate 102. That is, the third conductive layer 112 of the two rightmost stacks is electrically isolated. As a result, there is no coupling between the third conductive layer 112 and the substrate 102. In the leftmost first conductive stack, however, the third conductive layer 112 is coupled to the first via 110, which is coupled to the first conductive layer contact 108. The first conductive layer contact 108 is in turn coupled to the substrate 102.

In one configuration, there is an additional conductive material layer (not shown) which supports the first conductive layer contact 108, and which may also be directly coupled to the third conductive layer 112. This is further described as a first conductive layer 922 in FIGS. 9C and 9D.

Figure 9B:
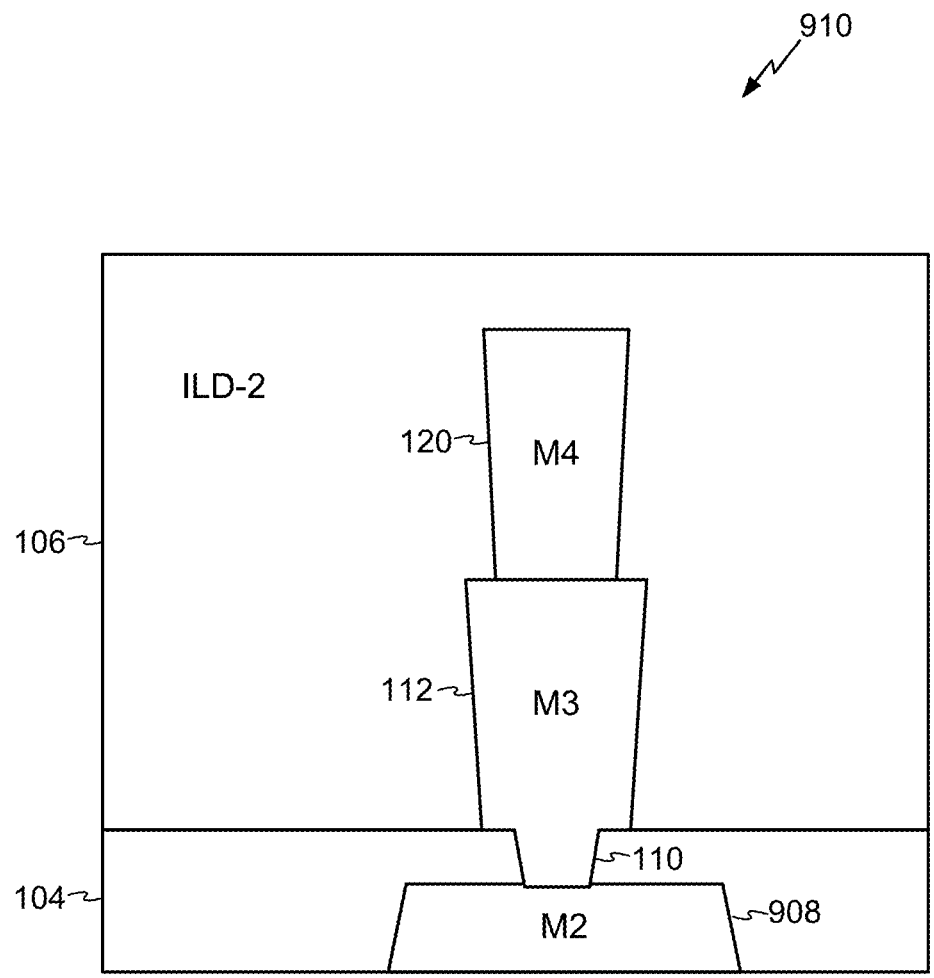

FIG. 9B shows a cross-sectional view 910 illustrating a configuration of various layers in a device fabricated from a conductive stack plating process according to one aspect of the disclosure. In the cross-sectional view 910, a second conductive layer 908 is deposited, and then a first via 110 is positioned on and directly coupled to the second conductive layer 908. The first via 110 may also be expressed as $V_{23}$. A third conductive layer 112 is positioned on and directly coupled to the first via 110. A fourth conductive layer 120 is positioned on and directly coupled to the third conductive layer 112. The second conductive layer 908 may also function as a redistribution layer (RDL). A second interlayer dielectric layer 106 surrounds both the third conductive layer 112 and the fourth conductive layer 120.

Figure 9C:
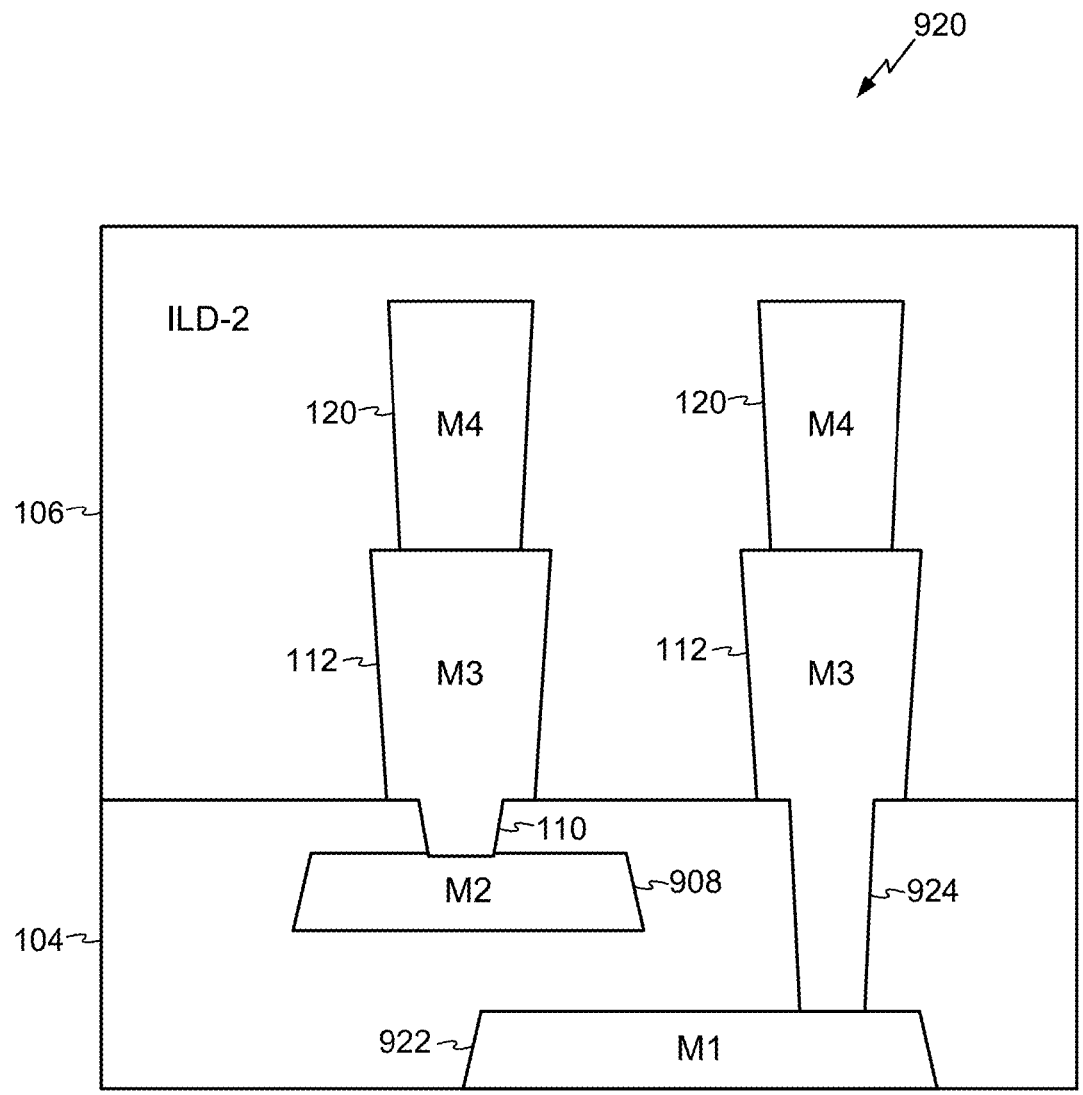

FIG. 9C shows a cross-sectional view 920 illustrating a configuration of various layers in a device fabricated from a conductive stack plating process according to one aspect of the disclosure. The cross-sectional view 920 contains elements similar to that of the cross-sectional view 910 of FIG. 9B, with the addition of a first conductive layer 922 and a second via 924. The second via 924 may also be expressed as $V_{13}$. The first conductive layer 922 may also be in contact with the second conductive layer 908, or those two layers may not be in contact, as shown in the cross-sectional view 920. The second conductive layer 908 and the first conductive layer 922 may each or both function as a redistribution layer (RDL). The second conductive layer 908 and the first conductive layer 922 may also function as a first plate and a second plate of a metal-insulator-metal (MIM) capacitor.

Figure 9D:
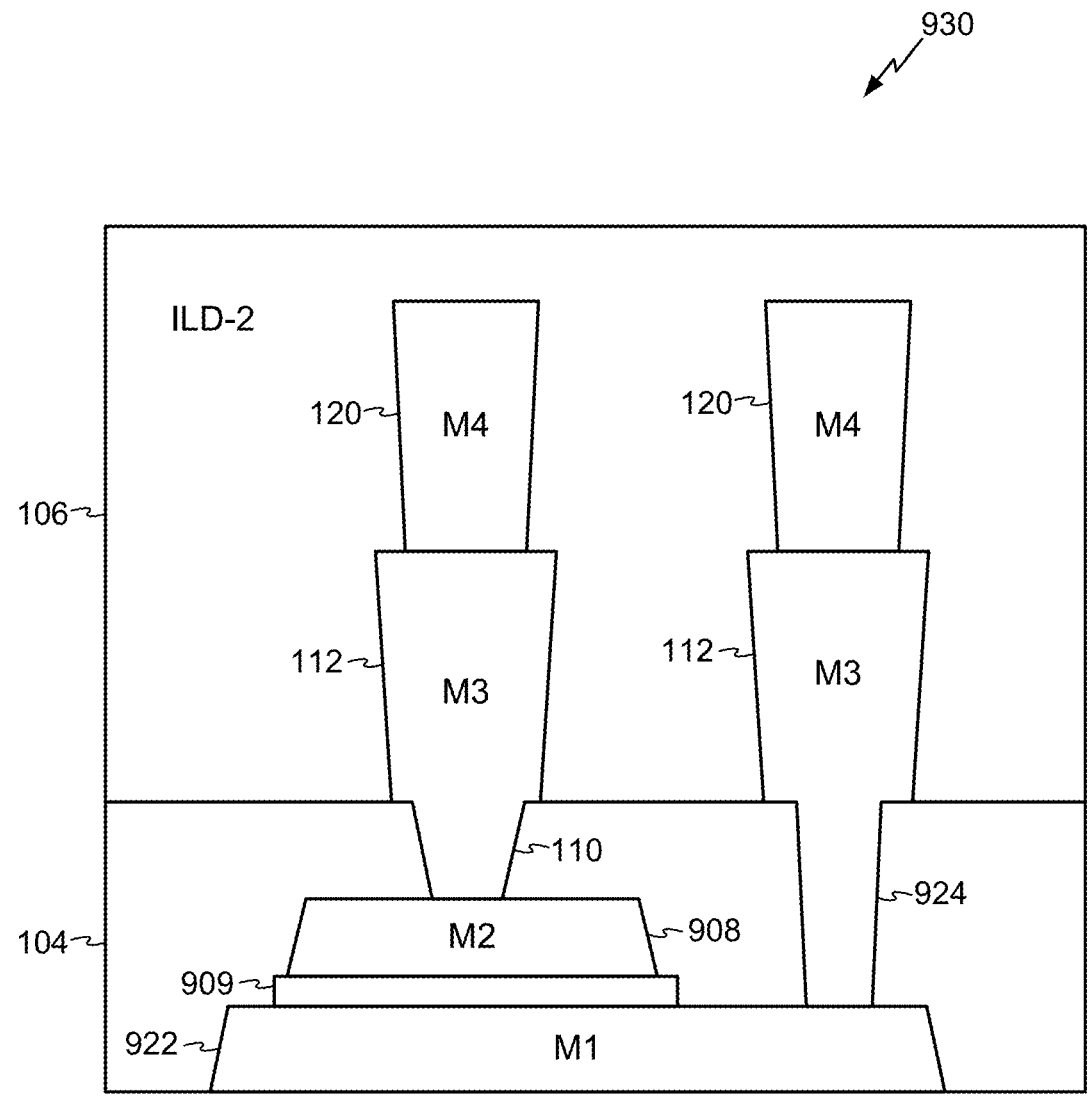

FIG. 9D shows a cross-sectional view 930 illustrating a configuration of various layers in a device fabricated from a conductive stack plating process according to one aspect of the disclosure. The cross-sectional view 930 contains elements similar to the cross-sectional view 920 of FIG. 9C, with the difference of a dielectric layer 909 positioned in between the second conductive layer 908 and the first conductive layer 922. Together, the second conductive layer 908, the dielectric layer 909 and the first conductive layer 922 may form a metal insulator metal (MIM) capacitor structure.

Figure 9E:
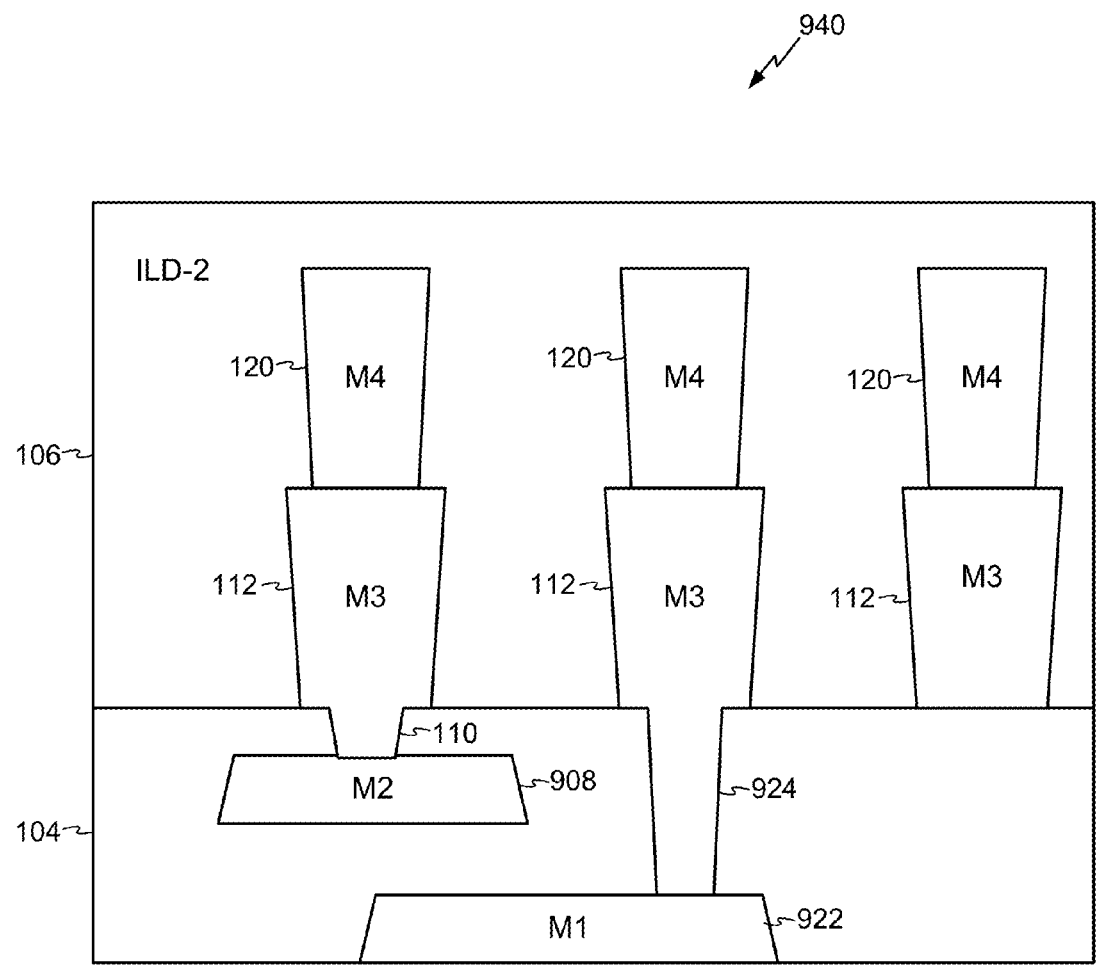

FIG. 9E shows a cross-sectional view 940 illustrating a configuration of various layers in a device fabricated from a conductive stack plating process according to one aspect of the disclosure. The cross-sectional view 940 contains elements similar to the cross-sectional view 920 of FIG. 9C, with the addition of the fourth conductive layer 120 positioned on and directly coupled to the third conductive layer 112 on the rightmost stack. The third conductive layer 112 is positioned on and directly coupled to the first interlayer dielectric layer 104. The first interlayer dielectric layer 104 does not function as a redistribution layer, so that the third conductive layer 112 is floating and not contacting a redistribution layer. In this configuration, the first conductive layer 922 and/or the second conductive layer 908 function as a redistribution layer.

In FIGS. 9B, 9C, 9D and 9E, there may also be a substrate below the first conductive layer 922 or the second conductive layer 908, in the case of FIG. 9B. In FIGS. 9B, 9C, 9D and 9E, a first conductive stack includes the third conductive layer 112 coupled to a portion of the second conductive layer 908 with the first via 110. In FIG. 9E, a second conductive stack includes the fourth conductive layer 120 directly on a portion of the third conductive layer 112 that is isolated from the substrate. That is, the third conductive layer 112 is electrically isolated and not coupled to the substrate by any layer or component whatsoever. In FIGS. 9B, 9C, 9D and 9E, a third conductive stack includes the third conductive layer 112 coupled to a portion of the first conductive layer 922 with the second via 924.

In accordance with an aspect of the present disclosure, FIGS. 9B, 9C, 9D and 9E can be achieved with one mask design at a time. FIGS. 9B, 9C, 9D and 9E may also be used for capacitor designs versus inductor designs. In typical implementations, for example, the third conductive layer 112 directly contacts a redistribution layer (RDL) without the implementation of vias.

Figure 10:
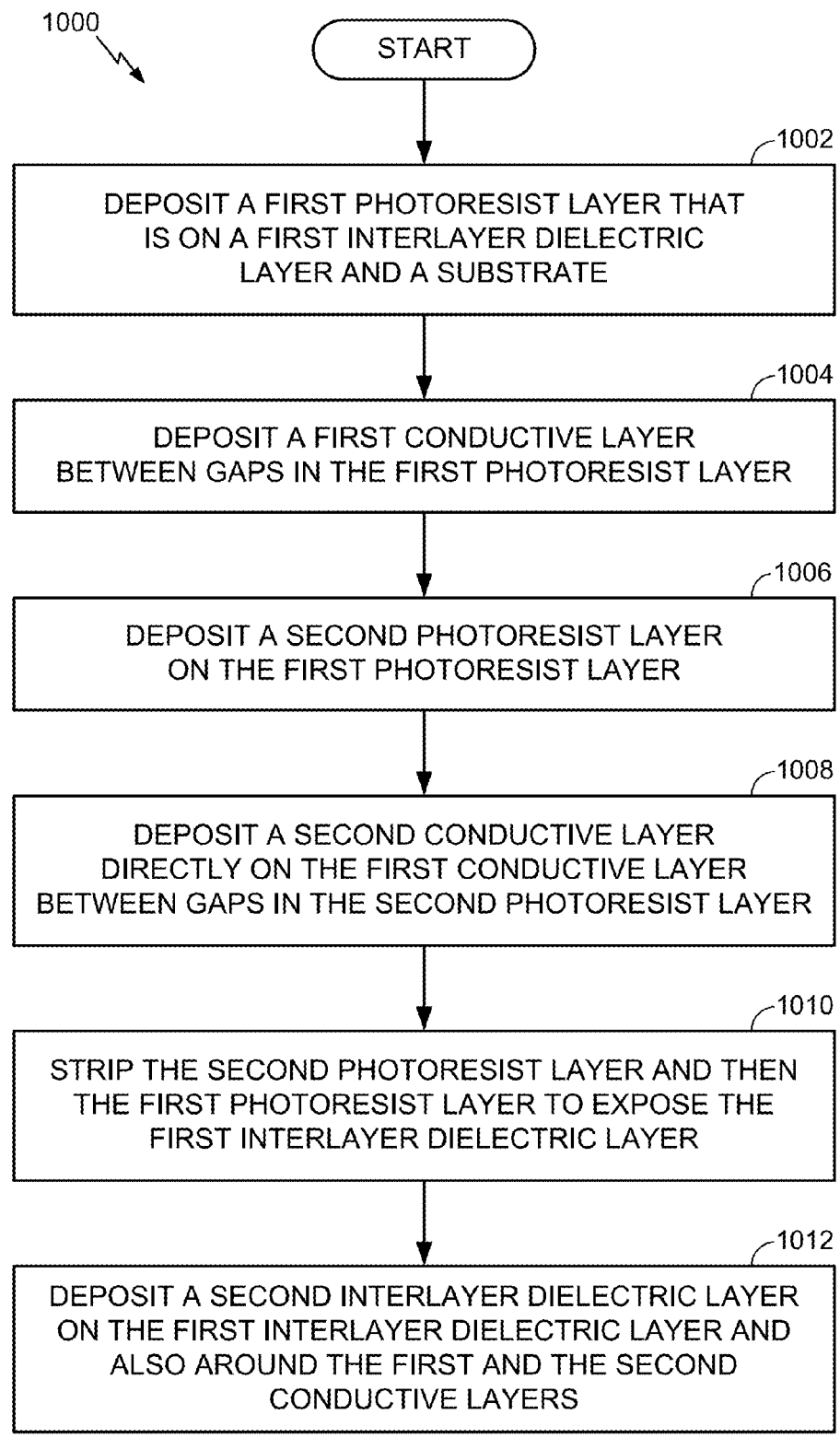
FIG. 10 is a process flow diagram illustrating a conductive stack plating process according to an aspect of the disclosure.

FIG. 10 is a process flow diagram illustrating a conductive stack plating process 1000 according to an aspect of the disclosure. In block 1002, a first photoresist layer (e.g., the first photoresist layer 124) is deposited on a first interlayer dielectric layer (e.g., the first interlayer dielectric layer 104) and a substrate (e.g., the substrate 102). This may be shown with reference to the device 330 of FIG. 3D. In block 1004, a first conductive layer (e.g., the third conductive material 126) is deposited between gaps in the first photoresist layer. This may be shown with reference to the device 340 of FIG. 3E.

Referring again to FIG. 10, in block 1006, a second photoresist layer (e.g., the second photoresist layer 128) is deposited on the first photoresist layer. This may be shown with reference to the device 350 of FIG. 3F. In block 1008, a second conductive layer (e.g., the fourth conductive material 132) is deposited directly on the first conductive layer between gaps in the second photoresist layer. This may be shown with reference to the device 360 of FIG. 3G. In block 1010, the second photoresist layer is stripped then the first photoresist layer is stripped to expose the first interlayer dielectric layer. This may be shown with reference to the device 370 of FIG. 3H. In block 1012, a second interlayer dielectric layer (e.g., the second interlayer dielectric layer 106) is deposited on the first interlayer dielectric layer and also around the first and the second conductive layers. This may be shown with reference to the device 390 of FIG. 3J.

In one configuration, an integrated circuit device includes a substrate that supports a contact. The device includes a first interlayer dielectric layer on the substrate and a portion of the contact. The device also includes a second means for conducting directly on a first means for conducting. The first conducting means may be coupled to the contact. The device also includes a second interlayer dielectric layer surrounding the first conducting means and the second conducting means. In one aspect of the disclosure, the first conducting means may be the third conductive layer 112 (e.g., M3) arranged to perform the functions recited by the first conducting means. In this aspect of the disclosure, the second conducting means may be the fourth conductive layer 120 (e.g., M4) arranged to perform the functions recited by the second conducting means. In another aspect, the aforementioned means may be any module or any apparatus configured to perform the functions recited by the aforementioned means.

Figure 11:
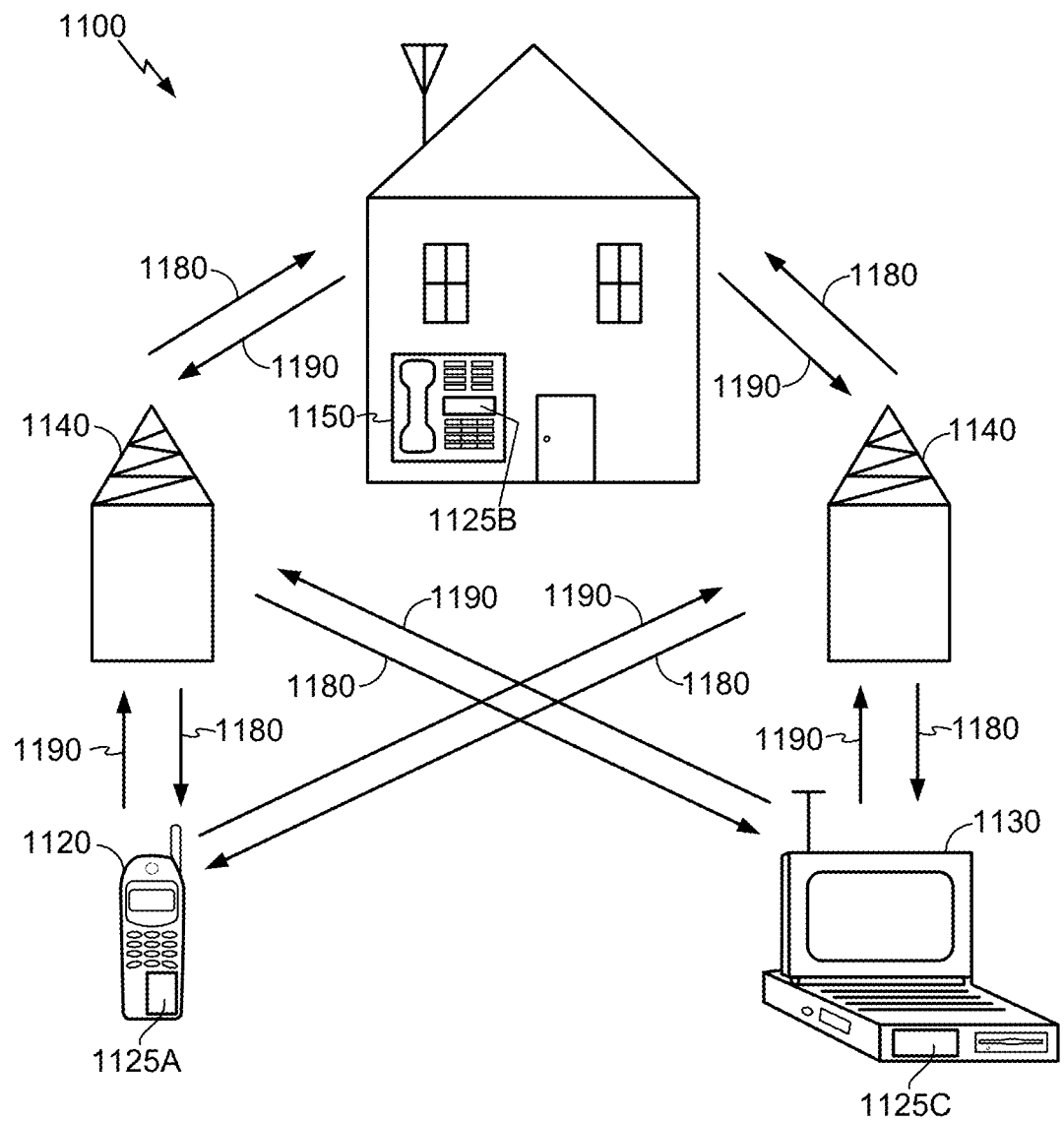
FIG. 11 is a block diagram showing an exemplary wireless communication system in which a configuration of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed devices (e.g. spiral inductors). It will be recognized that other devices may also include the disclosed devices (e.g. spiral inductors), such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed devices.

Figure 12:
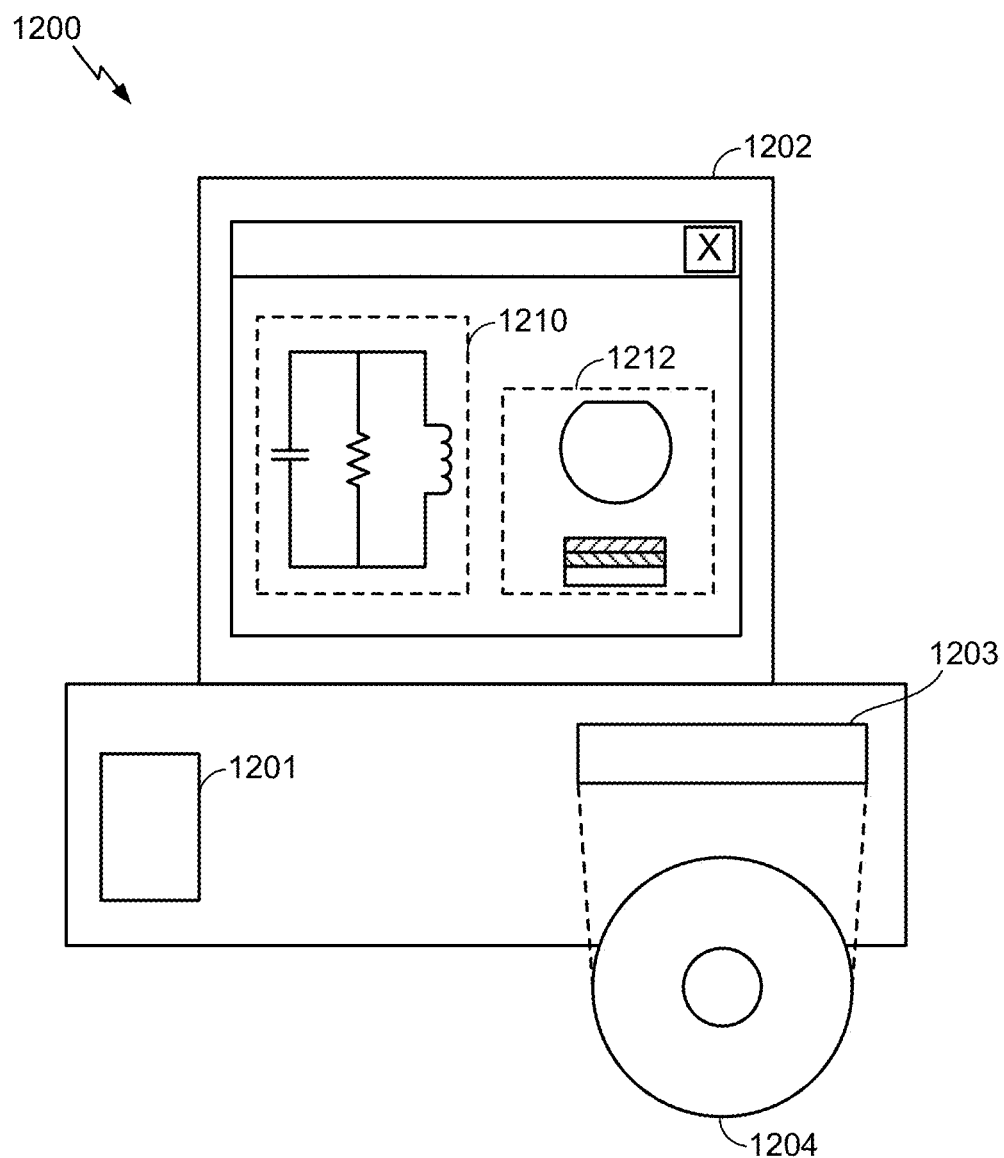
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the IC devices disclosed above. A design workstation 1200 includes a hard disk 1201 containing operating system software, support files, and design software such as Cadence or OrCAD. The design workstation 1200 also includes a display 1202 to facilitate design of a circuit 1210 or a semiconductor component 1212 such as the disclosed device (e.g., a spiral inductor device). A storage medium 1204 is provided for tangibly storing the circuit design 1210 or the semiconductor component 1212. The circuit design 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit design 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device, comprising:
a substrate;
a first interlayer dielectric layer on the substrate comprising a first conductive layer and a second conductive layer;
a first conductive stack comprising a third conductive layer coupled to a portion of the first conductive layer in which a first via couples the third conductive layer to the portion of the first conductive layer, in which the first conductive stack is not isolated from the substrate;
a second conductive stack comprising a fourth conductive layer directly on a portion of the third conductive layer that is isolated from the substrate; and
a second interlayer dielectric layer surrounding the third conductive layer and the fourth conductive layer.

2. The integrated circuit device of claim 1, further comprising:
a third conductive stack comprising the third conductive layer coupled to a portion of the first conductive layer with a second via.

3. The integrated circuit device of claim 2, further comprising:
a seed layer on the first interlayer dielectric layer that is coupled to the first conductive layer.

4. The integrated circuit device of claim 1, in which the first conductive layer and the second conductive layer comprise at least a first plate and a second plate of a metal-insulator-metal (MIM) capacitor.

5. The integrated circuit device of claim 1, further comprising:
a seed layer on the first interlayer dielectric layer that is coupled to the second conductive layer.

6. The integrated circuit device of claim 1 incorporated into at least one of a music player, a video player, an entertainment unit, a navigation device, a communications device, a personal digital assistant (PDA), a fixed location data unit, and a computer.

7. An integrated circuit device, comprising:
a substrate;
a first interlayer dielectric layer on the substrate comprising a first conductive means and a second conductive means;
a first conductive stack comprising a third conductive means coupled to a portion of the first conductive means, in which a first via couples the third conductive means to the portion of the first conductive means, in which the first conductive stack is not isolated from the substrate;
a second conductive stack comprising a fourth conductive means directly on a portion of the third conductive means that is isolated from the substrate; and
a second interlayer dielectric layer surrounding the third conductive means and the fourth conductive means.

8. The integrated circuit device of claim 7, further comprising:
a third conductive stack comprising the third conductive means coupled to a portion of the first conductive means with a second via.

9. The integrated circuit device of claim 8, further comprising:
   a seed layer on the first interlayer dielectric layer that is coupled to the first conductive means.

10. The integrated circuit device of claim 7, in which the first conductive means and the second conductive means comprise at least a first plate and a second plate of a metal-insulator-metal (MIM) capacitor.

11. The integrated circuit device of claim 7, further comprising:
   a seed layer on the first interlayer dielectric layer that is coupled to the second conductive means.

12. The integrated circuit device of claim 7 incorporated into at least one of a music player, a video player, an entertainment unit, a navigation device, a communications device, a personal digital assistant (PDA), a fixed location data unit, and a computer.

\* \* \* \* \*